(12) United States Patent
Senatori

(10) Patent No.: US 9,055,683 B2
(45) Date of Patent: Jun. 9, 2015

(54) HERMETIC SEAL

(75) Inventor: Mark David Senatori, The Woodlands, TX (US)

(73) Assignee: Hewlett-Packard Development Company, L.P., Houston, TX (US)

(*) Notice: Subject to any disclaimer, the term of this patent is extended or adjusted under 35 U.S.C. 154(b) by 136 days.

(21) Appl. No.: 13/981,065

(22) PCT Filed: Feb. 28, 2011

(86) PCT No.: PCT/US2011/026429
§ 371 (c)(1),
(2), (4) Date: Jul. 22, 2013

(87) PCT Pub. No.: WO2012/118474
PCT Pub. Date: Sep. 7, 2012

(65) Prior Publication Data
US 2013/0300265 A1    Nov. 14, 2013

(51) Int. Cl.
*G02F 1/1333* (2006.01)
*H05K 5/06* (2006.01)
*G06F 1/16* (2006.01)
*H05K 5/00* (2006.01)

(52) U.S. Cl.
CPC .............. *H05K 5/068* (2013.01); *G06F 1/1656* (2013.01); *H05K 5/0017* (2013.01)

(58) Field of Classification Search
CPC ............ G02F 1/133308; G02F 1/1333; G02F 1/1339; G02F 2001/133317; G02F 2001/13332; G02F 2202/28; G03B 17/08; G03F 7/70833; H05K 3/323; H05K 5/0017; H05K 5/0204; H05K 5/061; Y10S 345/905
USPC ............ 361/752, 679.55, 758, 770, 804, 807, 361/810; 156/305; 257/678; 312/223.2; 349/58, 60, 122, 153; 174/564
See application file for complete search history.

(56) References Cited

U.S. PATENT DOCUMENTS

| 2005/0185110 A1 | 8/2005 | Lai et al. |
| 2009/0101384 A1 | 4/2009 | Kawasaki et al. |
| 2010/0182531 A1 | 7/2010 | Teratani |

FOREIGN PATENT DOCUMENTS

JP    2008003392    1/2008

OTHER PUBLICATIONS

International Searching Authority, The International Search Report and the Written Opinion, Nov. 4, 2011, 9 Pages.

*Primary Examiner* — Thoi Duong
(74) *Attorney, Agent, or Firm* — Hewlett-Packard Patent Department

(57) ABSTRACT

Embodiments provide apparatuses and systems associated with a hermetic seal. The hermetic seal may include a bumper that protrudes past a top surface of the bezel to protect a display and a damper that couples to a cover to support the display.

14 Claims, 3 Drawing Sheets

HERMETIC SEAL

BACKGROUND

Computing devices are ubiquitous in both personal and professional activities. The ever-present nature of these devices may lead to an increase in reliability issues stemming from, for example, transportation, storage, or usage in various environments. To reduce these issues, various computing devices have moved toward more rugged and robust designs.

DETAILED DESCRIPTION

Computing devices such as, but not limited to, notebook computers, may experience damage through transportation, storage, and use in varying environments. For example, transporting a computing device may lead to vibrations and jostling of various components. As another example, storage and use of the device in various environments may introduce dust, moisture, or other elements that may be detrimental to the computing device and Its components.

In the present disclosure, a hermetic seal and its use in a computing system are disclosed. The hermetic seal may function to protect various components of the computing system from unwanted particulates, vibrations, and from contact with other components.

Figure 1:
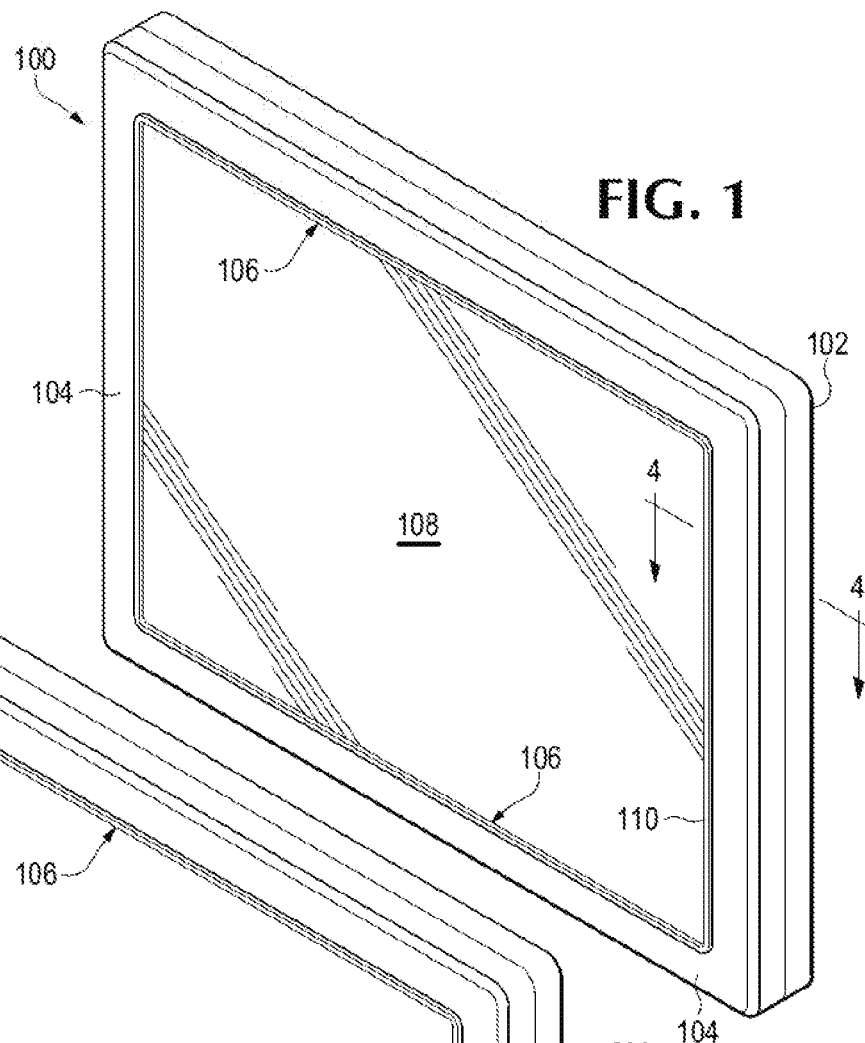
FIG. 1 illustrates a perspective view of a system in accordance with various embodiments.
Figure 2:
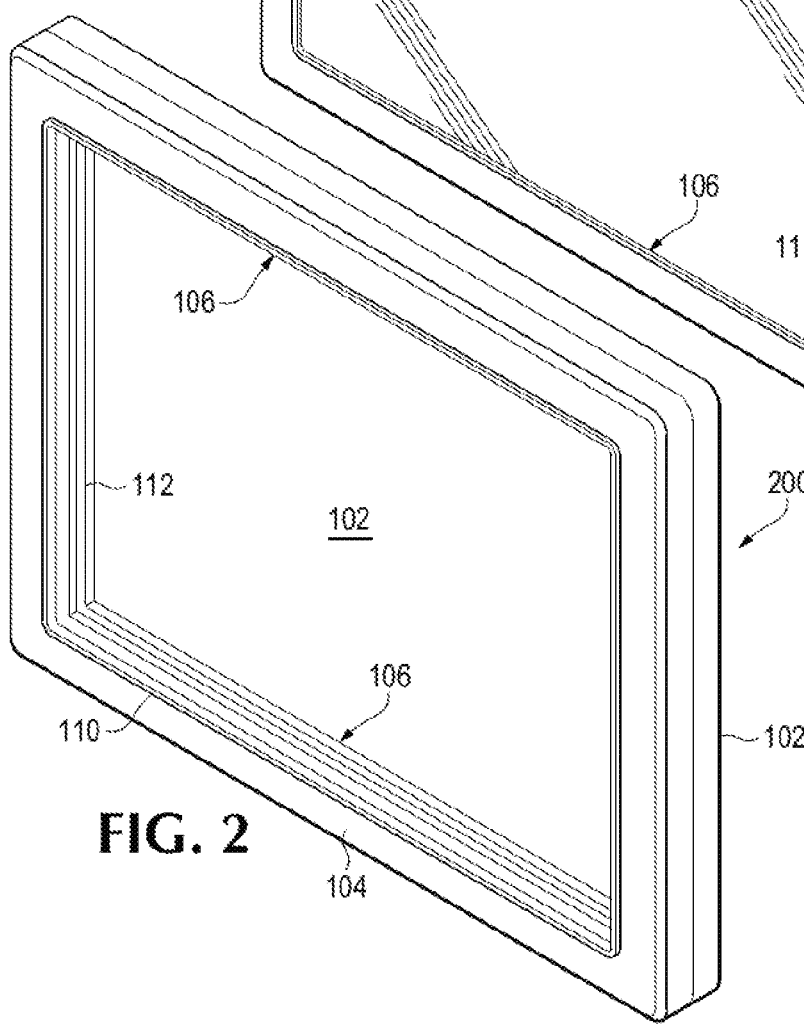
FIG. 2 illustrates a perspective view of a system in accordance with various embodiments.

Referring to FIGS. 1 and 2, systems 100 and 200 are illustrated in accordance with various embodiments. The systems comprise a cover 102, a bezel 104 coupled to the cover 102, and a hermetic seal 106. In the embodiment illustrated in FIG. 1, the system 100 additionally includes a display 108.

In various embodiments, the systems 100 and 200 may be a computing system such as, but not limited to, a tablet computer or a slate computer, in other embodiments, the systems 100 and 200 may be part of a larger computing system, such as, but not limited to, a notebook computer, a netbook computer, or a desktop computer. Other systems and uses of the disclosure are contemplated. The cover 102 may be utilized as a back plate for the computing systems 100 or 200, while the bezel 104 is utilized as a front cover that borders the display 108.

In various embodiments, the system 100 may include a display 108. The display 108 may include a liquid crystal display (LCD), light emitting diode (LED) display, a organic light emitting diode (OLED) display, or any other type of display. The display 108 may additionally comprise a top-glass or protective cover. The top-glass or protective cover 108 may be a transparent material having a hardness which provides scratch resistance and durability in computing devices and systems. In various embodiments, the system 100 may be manufactured and produced without the display 108, as seen in FIG. 2. The system 200 may be configured to receive a display 108 prior to finalizing the product. Consequently, the system 200 of FIG. 2 may provide a drop in for display 108.

In various embodiments, the hermetic seal 106 is a seal configured to form an air-tight or vacuum seal. Once generated, the hermetic seal 106 may sustain such an airtight environment, thus preventing the entrance of particulates, such as but not limited to dust and water. The hermetic seal 106 may be disposed along a boundary of the bezel 104 and/or the display 108, and be configured to support and protect the display 108. For example the hermetic seal 106 may be disposed along an inner edge of the bezel 104, and therefore, may serve to separate the display 108 from the bezel 104. The hermetic seal 106 may comprise a bumper 110 that protrudes past a top surface of the bezel 104 to protect the display 108. By protruding past the top surface of the bezel 104, the bumper 110 may prevent various objects from contacting the surface of the display 108 and/or the bezel 104. For example, if the system 100 were to be laid down on a counter-top with the display 108 facing down, the bumper 110 may elevate the display 108 and the bezel 104 so that they do not rest on the counter-top, thereby preventing possible damage such as, but not limited to, scratches.

In various embodiments, the hermetic seal 106 also comprises a damper 112 coupled to the cover 102. The damper 112 comprises the portion of the hermetic seal 106 between the display mount and the portion of the hermetic seal 106 that is configured to engage the cover 102. The damper 112 may be configured to support the display 108. Supporting the display 108 may include separating the display 108 from the cover 102, in various embodiments, this separation may enable the display to move in response to vibrations or jolts. For example, the damper 112 may enable the display 108 approximately 2 to 3 millimeters of movement. This movement may lessen the impact of vibrations and jolts on the various components. Additional or wider ranges of movement are contemplated.

In addition to providing support, the damper 112 may also be configured to reduce vibrations and their effects on the electronics contained within the hermetic seal 106. To reduce vibrations and their effects on the electronics contained within the hermetic seal 106, the damper 112 may comprise a shock absorber. The shock absorber may include an undulating surface, a corrugation, or other elements configured to absorb and further dampen vibrations.

Figure 3:
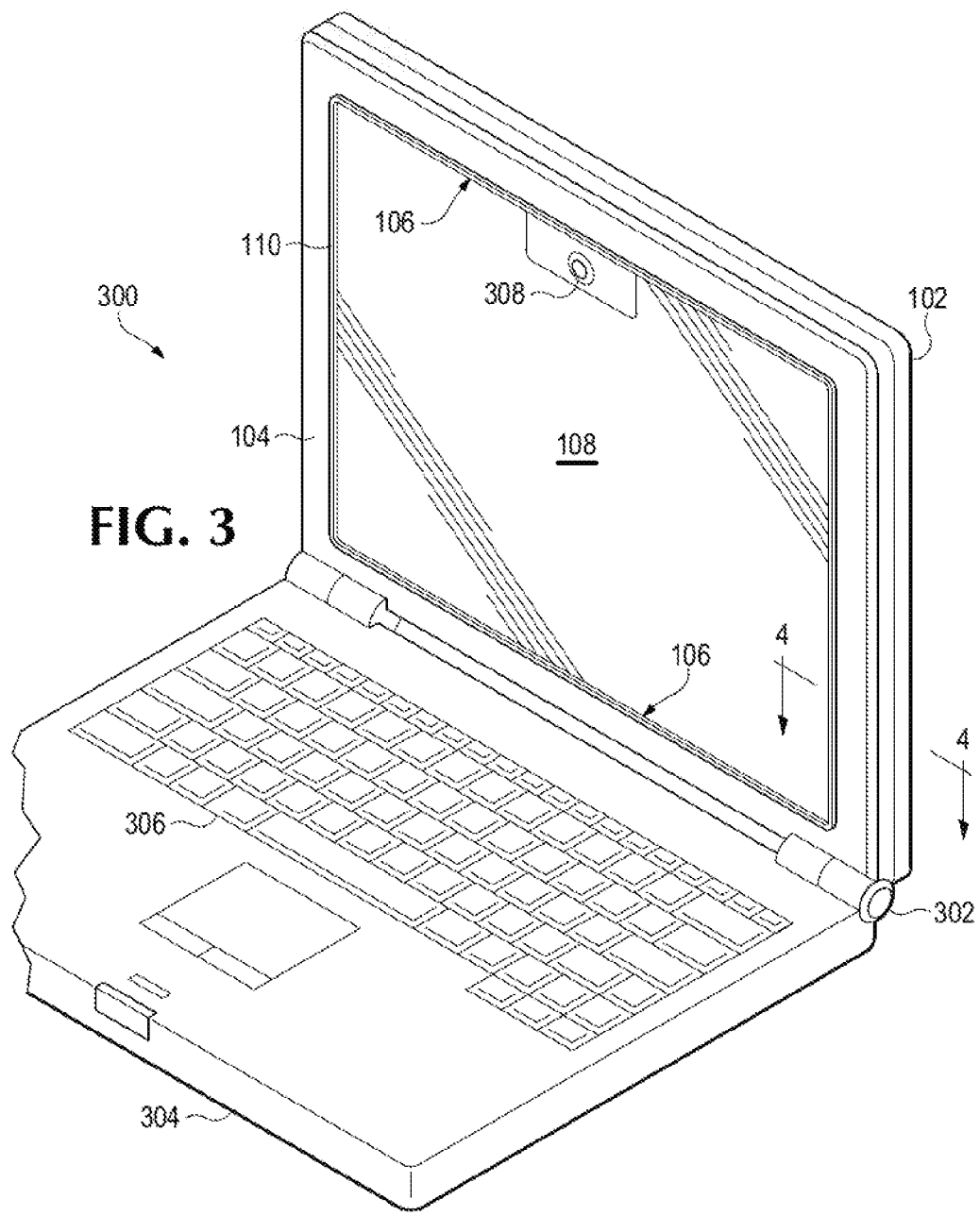
FIG. 3 illustrates a perspective view of a system in accordance with various embodiments.

Referring now to FIG. 3, another embodiment is illustrated in accordance with the present disclosure. The system 300 may be a notebook or netbook computer. The system 300 may comprise a cover 102, a bezel 104, a hermetic seal 106 having a bumper 110 and a damper (not illustrated), a display 108, a base 304 having a keyboard 306, and a hinge 302 coupling the base 304 to the cover 102.

In addition, the system 300 may also include various other components such as, but not limited to, a camera 308, microphones (not illustrated), and electronics associated with touch displays (not illustrated). These components may be disposed, partially or entirely, within the hermetically sealed area formed by the hermetic seal 106.

In various embodiments, the cover 102, the bezel 104, the hermetic seal 106 having the bumper 110 and damper (not illustrated), and the display 108 may function as described with reference to FIGS. 1 and 2. In the embodiment, the hinge 302 may serve as an axis point, about which, the base 304 and the cover 102 (and associated components) may pivot. For example, in the embodiment, the cover 102 may pivot about hinge 302 to come into contact with base 304 in a clam-shell manner, in the closed position, wherein the display 108 is brought into close proximity to the keyboard 306, the bumper 110 of the hermetic seal 106 may contact the base 304 and/or the keyboard 306. Furthermore, because the bumper 110 protrudes beyond a top surface of the bezel 104, and consequently the top-glass or protective cover of display 108, the display 108 is protected from contact with the keyboard 306 and/or base 304.

The hermetic seal 106 may further comprise a damper. The damper may be configured to support the display 108. The damper may be coupled to the back side of the cover 102 and provide an air-tight environment for components within the seal, in other words, the environment may comprise an area confined by the cover 102, the hermetic seat 106, and the display 108.

Figure 4:
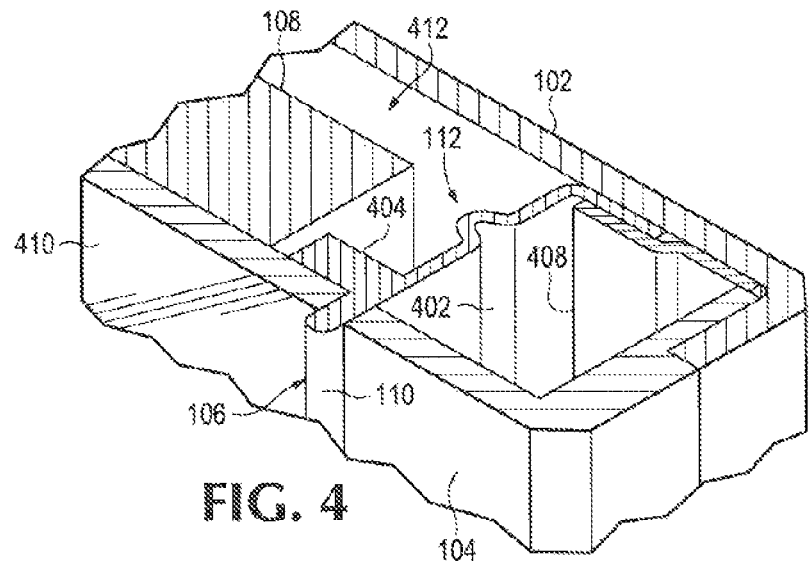
FIG. 4 illustrates a cross sectional view in accordance with various embodiments.

Referring to FIG. 4, a cross sectional view of the systems of FIGS. 1 and 3 (as indicated in FIGS. 1 and 3) is illustrated in accordance with various embodiments, in the illustrated embodiment, a hermetic seal 106 having a bumper 110, a damper 112, and a display mount 404 is illustrated. Additionally, the embodiment includes a display 406 along with its corresponding top-glass or protective cover 410, bezel 104, cover 102, and a compression flange 408.

The hermetic seal 106 includes bumper 110, damper 112 and display mount 404. The bumper 110 may protrude past a top surface of bezel 104. Additionally, in the illustrated embodiment, the protective cover 410 of display 108 is co-planar with the bezel 104. In other words, the top surface of the protective cover 410 is even with the top surface of the bezel 104. Consequently, the bumper 110 of the hermetic seal 106 protrudes beyond the top surface of the bezel 104 and the display 108.

The hermetic seal 106 also includes a damper 112. The damper 112, in various embodiments, is configured to support the display 108. To support the display 108, the damper 112 of the hermetic seal 106 may brace the display 108 against the cover 102. This may enable the display 108 an amount of separation from the cover 102. Additionally, the damper 112 of the hermetic seal 112 may include one or more shock absorbers 402. The shock absorbers 402 may be corrugations, undulating surfaces, or other elements that are configured to absorb shock. The shock absorbers 402 may be configured to dampen vibrations and enable the display 108 to move in response to vibrations or jolts. The movement is further enabled by the separation of the display 108 from the cover 102.

In addition to the damper 112 and the bumper 110, the hermetic seal 106 may also include a display mount 404. The display mount 404 may be configured to couple with either the protective cover 108, or with the protective cover 410 and the display 108. In the illustrated embodiment, the display mount 404 is coupled with the protective cover 410. The protective cover 410 may be coupled to the display mount 404 via an adhesive. The adhesive may be disposed in a manner that maintains the hermetically sealed environment provided, in part, by the hermetic seal 106.

In the embodiment in which the protective cover 410 and the display 108 are coupled to the display mount 404, adhesives and mechanical fasteners may be utilized. The adhesives may be disposed in a manner that maintains the hermetically sealed environment provided, in part, by the hermetic seal 106, and the fasteners may be configured to provide additional support to the display 108. Fasteners can include screws, clips, or other mechanical components. Adhesives may include glues, sealants, caulking, or other elements configured to seal and adhere.

In various embodiments, a compression flange 408 may be utilized to maintain the hermetically sealed environment enabled by the hermetic seal 106. The compression flange 408 may be a variety of materials ranging from plastics to metal. The compression flange 408 is configured to compress the hermetic seal 106 against the cover 102. The compression flange 408 may be disposed around a perimeter of the hermetic seal 106. Additionally, as viewed in the illustration, the compression flange 408 may also be compressed against the cover 102 via an internal portion of the bezel 104.

In various embodiments, with the hermetic seal 106 being coupled along a periphery of the cover 102 (via compression flange 408) and a periphery of the display 108 (via protective cover 410), the hermetic seal 106 may delineate a sealed area 412. The sealed area 412 may house the internal electronics associated with the display 108, various additional components (e.g., camera, microphone, etc), and transmission wires (not illustrated). The sealed environment 412 may protect the mentioned electronics and components from damage caused by particulates and/or moisture, as examples.

Figure 5:
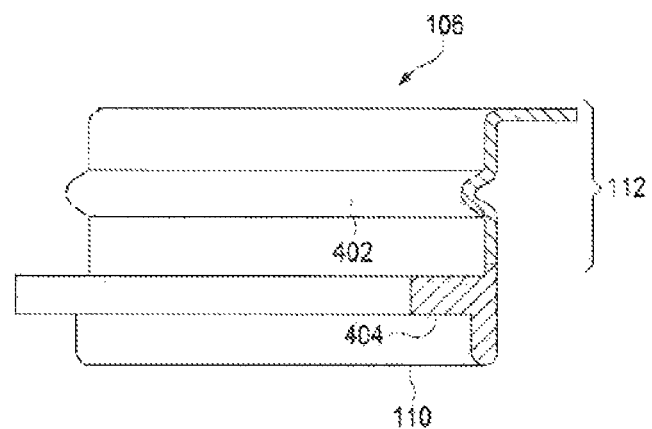
FIG. 5 illustrates a perspective view of a hermetic seal in accordance with various embodiments.

Referring now to FIG. 5, a perspective view of a hermetic seal 106 is illustrated in accordance with the present disclosure. The hermetic seal 106 may comprise a damper 112 having a shock absorber 402, a bumper 110, and a display mount 404, in various embodiments, the hermetic seal 106 may comprise one or more plastic molded materials. The materials may be configured to maintain an air-tight or hermetic seal around the display 108 and internal components.

In FIG. 5, the hermetic seal 106 is a co-molded hermetic seal. For example, the bumper 110 of the hermetic seal 106 and the display mount 404 of the hermetic seal 106 may comprise a material having a first hardness, and the damper 112 of the hermetic seal 106 may comprise a material having a second hardness, wherein the first hardness is different than the second hardness.

In various embodiments, the first hardness may be configured to protect the display 108 by separating the display 108 from various objects, e.g., counter-tops, keyboards, or other objects. The first hardness may be configured to compress, but prevent objects, such as a keyboard or base of a notebook, from coming into contact with the display 108. The first hardness may be consistent with materials including, but not limited to, rubber materials having varying elasticity and plastics.

In various embodiments, the second hardness may be configured to with a specific dampening resistance. For example, the second hardness may be configured to enable the damper 112 and shock, absorber 402, to absorb shock and vibration. The second hardness may enable the display 108 to move within the sealed area in response to shock and vibration without allowing the display 108 to contact the cover 102. The second hardness may be consistent with materials including, but not limited to, rubber materials having varying elasticity and plastics.

The hermetic seal 106 may include a damper 112 configured to support a display along a boundary of the display. The boundary of the display may be defined as an outer edge of the display or an outer edge of the protective cover. Consequently, the damper 112 may be disposed in a manner that substantially mirrors the shape of a display. For example, the damper 112 may engage a cover forming a rectangular enclosed area in which a display may be disposed. In various embodiments, the damper 112 may include a shock absorber. The shock absorber may be in the form of a corrugation or an undulating surface. Other shock absorbers are contemplated.

The hermetic seal 106 may include a display mount 404. The display mount 404 may be configured to engage a display 108. For example, a first surface of the display mount 404 may be configured to engage and support a protective cover of the display 108, in another embodiment, the display mount 404 may be configured to engage a protective cover of the display 108 on a first side and engage the display 108 on a second side. The first side may engage the protective cover along with an adhesive while the second side may engage the display 108 via one or more mechanical fasteners.

The hermetic seal 106 may include a bumper 110. The bumper 110 may be configured to protrude past a top surface of the display. By protruding past a top surface of the display, the bumper 110 may provide protection to the display and/or protective cover. A top surface of the display may be defined as the surface utilized to convey images to a user.

Although certain embodiments have been illustrated and described herein, if will be appreciated by those of ordinary skill in the art that a wide variety of alternate and/or equivalent embodiments or Implementations calculated to achieve the same purposes may be substituted for the embodiments shown and described without departing from the scope of this disclosure. Those with skill in the ad will readily appreciate that embodiments may be implemented in a wide variety of ways. This application is intended to cover any adaptations or variations of the embodiments discussed herein. Therefore, it is manifestly intended that embodiments be limited only by the claims and the equivalents thereof.

What is claimed is:

1. A system, comprising:
a cover;
a bezel coupled to the cover; and
a hermetic seal disposed along a boundary of the bezel, wherein the hermetic seal includes a bumper that protrudes past a top surface of the bezel and a damper coupled to the cover to support a display.

2. The system of claim 1, further comprising:
a compression flange coupled to the hermetic seal, wherein the compression flange is configured to compress the hermetic seal against the cover.

3. The system of claim 1, further comprising:
the display, wherein the display is coupled to the hermetic seal.

4. The system of claim 3, wherein the display comprises a liquid crystal display (LCD).

5. The system of claim 3, wherein the display comprises a protective cover, wherein the protective cover is co-planar with the bezel.

6. The system of claim 3, wherein the display is coupled to the hermetic seal by an adhesive.

7. The system of claim 3, wherein the hermetic seal is further configured to separate the display from the bezel.

8. The system of claim 1, wherein the bumper of the hermetic seal comprises a first hardness and the damper of the hermetic seal comprises a second hardness, the first hardness being different than the second hardness.

9. The system of claim 1, further comprising:
a camera coupled to the cover, wherein an electrical connection of the camera is disposed within the hermetic seal.

10. The system of claim 1, further comprising:
a keyboard; and
wherein the bumper on the hermetic seal is configured to separate the display from the keyboard.

11. The system of claim 1, wherein the damper comprises a shock absorber configured to absorb vibration.

12. A hermetic seal, comprising:
a damper configured to support a display and maintain a hermetic seal along a boundary of the display;
a display mount coupled to the damper, wherein the display mount is configured to engage the display; and
a bumper coupled to the display mount, wherein the bumper is configured to protrude past a top surface of the display;
wherein the display mount and the bumper comprise a first hardness; and
wherein the damper comprises a second hardness that is different than the first hardness.

13. The hermetic seal of claim 12, wherein the display mount is further configured to engage a protective cover coupled to the display.

14. The hermetic seal of claim 12, wherein the damper comprises a shock absorber.

* * * * *